United States Patent
Towle et al.

(10) Patent No.: US 7,372,120 B1
(45) Date of Patent: May 13, 2008

(54) METHODS AND APPARATUS TO OPTICALLY COUPLE AN OPTOELECTRONIC CHIP TO A WAVEGUIDE

(75) Inventors: Steven Towle, deceased, late of Phoenix, AZ (US); by Anna M. George, legal representative, Mountain View, CA (US); Daoqiang Lu, Chandler, AZ (US); Henning Braunisch, Chandler, AZ (US); Gilroy Vandentop, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/664,475

(22) Filed: Sep. 17, 2003

(51) Int. Cl.
*H01L 31/0203* (2006.01)
*H01L 31/00* (2006.01)
*H01L 23/48* (2006.01)
*H01L 23/52* (2006.01)
*H01L 23/40* (2006.01)
*H01L 33/00* (2006.01)

(52) U.S. Cl. ............... 257/432; 257/99; 257/433; 257/444; 257/E33.067

(58) Field of Classification Search ............ 257/99, 257/777–795, 431–448, E33.067
See application file for complete search history.

(56) References Cited

U.S. PATENT DOCUMENTS 6,834,133 B1 * 12/2004 Towle et al. .............. 385/14
6,907,151 B2 * 6/2005 Yunus ..................... 385/14
2002/0135543 A1 * 9/2002 Kitamura et al. ......... 345/55
2003/0091264 A1 * 5/2003 Kimerling ................. 385/14

OTHER PUBLICATIONS

Baggs, J; Machon, W; Magill, P; Mis, J; Rinne, G. "Solder Alloy Selection for Flip Chip on Board." International Material and Packaging Society Symposium, Brasleton, Georgia. Feb. 1998. pp. 1-5.

Bogaerts, W; Bienstman, P; Baets, R. "Sidewall Roughness in Photonic Crystal Slabs: A Comparison of High-Contrast Membranes and Low-Contrast III-V Epitaxial Structures." 11th International Workshop on Optical Waveguide Theory and Numerical Modelling, Apr. 4-5, 2003, Prague, Czech Republic. pp. 1-4.

"Polymer Technology Overview." Optical Crosslinks, Incorporated. 2001. pp. 1-10. Retrieved from internet: <URL: http://www.opticalcrosslinks.com/pdf/WebPolymerTECHNOLOGYPlatform.pdf>.

"Polymer Technology: Performance Data and Design Considerations." Optical Crosslinks, Incorporated. 2001. pp. 1-9. Retrieved from internet: <URL: http://www.opticalcrosslinks.com/pdf/WebPerformanceDataDesignTECHNOLOGY.pdf>.

* cited by examiner

*Primary Examiner*—Cuong Nguyen
(74) *Attorney, Agent, or Firm*—Hanley, Flight, & Zimmerman, LLC

(57) ABSTRACT

Methods and apparatus to optically couple an optoelectronic chip to a waveguide are disclosed. A disclosed apparatus includes a substrate, a waveguide mounted on the substrate and an optoelectronic chip bonded to the substrate and having an optical element directly engaging the waveguide.

31 Claims, 2 Drawing Sheets

METHODS AND APPARATUS TO OPTICALLY COUPLE AN OPTOELECTRONIC CHIP TO A WAVEGUIDE

FIELD OF THE DISCLOSURE

The present disclosure relates generally to optical packages and, more particularly, to methods and apparatus to optically couple an optoelectronic chip to a waveguide.

BACKGROUND

Optical packages are typically manufactured using traditional methods that enable optoelectronic chips to communicate with other optoelectronic chips using optical signal transmissions. These traditional methods often include wire-bonding and/or flip-chip packaging processes. It is known that these optical packages are generally used in an optical communication system for transmitting and receiving high bandwidth optical signals.

Optical wire-bond packages and optical flip-chip packages both generally include an optoelectronic chip, a substrate and a light conducting element such as, for example, an optical fiber or a waveguide. The optoelectronic chip includes an optical element and electrically conductive contacts. The optical element, which may include a transmitter and/or receiver, is generally responsible for transmitting and/or receiving optical signals through the optical fiber and/or waveguide. The optical fiber and/or waveguide is generally adhered or attached to a substrate. Additionally, electrically conductive contacts are electrically bonded to a substrate for transmitting and/or receiving electrical signals.

A wire-bonding packaging process is generally carried out by individually bonding each electrically conductive contact of an optoelectronic chip to a substrate using wire (e.g., gold wire, aluminum wire, etc.) and a wire-bonding machine. This is a time consuming process. The time required to wire-bond each optical package impacts the overall time and cost related to implementing and executing the wire-bonding package manufacturing process. In addition to limitations during the manufacturing process, wire-bonding packaging may suffer from quality and reliability issues of the wire-bond. A typical wire-bond generally has an overall length associated with a distance measured from the optoelectronic chip electrical contact to the substrate. The overall length of the wire-bond may introduce electrical parasitics such as capacitance and inductance, thereby creating undesirable signal bandwidth limitations and signal loss. Additionally, the wire-bond may also be susceptible to quality defects, such as, for example wire-bond breaks or wire-bond detachment. The manufacturing and performance limitations presented here have led many chip manufacturers to turn to alternate packaging techniques such as flip-chip packaging.

It is known that flip-chip packaging is a proven method for manufacturing optical packages. A flip-chip package may include a waveguide that is adhered to a substrate and that is disposed between an optoelectronic chip and the substrate. During a bonding process, the optoelectronic chip is positioned relative to the waveguide using an active alignment process to achieve optimal light signal transmission through the waveguide, thus adding time and cost to the overall flip-chip packaging process. Additionally, the flip-chip packaging process generally results in an air gap disposed between the optical element and the waveguide. The air gap results in a chip-air interface and an air-waveguide interface. Fressnel losses and/or beam divergence often occur when light crosses such interfaces.

DETAILED DESCRIPTION

Figure 1:
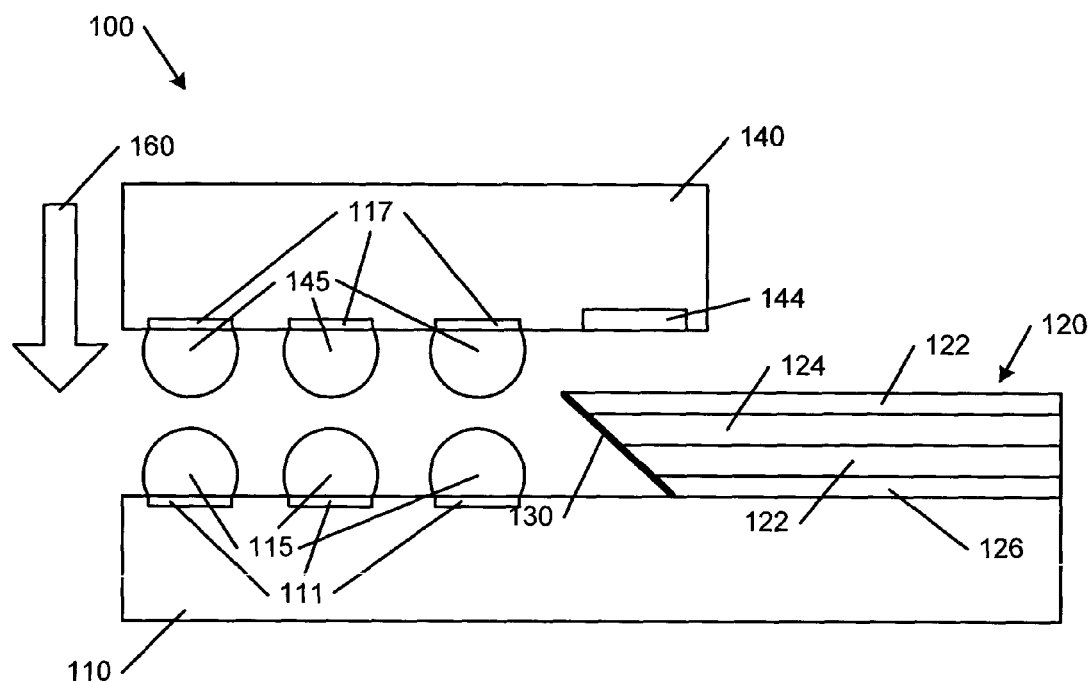
FIG. 1 is a cross-sectional view of an example optical package shown prior to undergoing a soldering process.

FIG. 1 is a cross-sectional view of an example optical package 100 prior to assembly. The example optical package 100 includes a substrate 110, a waveguide 120 mounted on the substrate 110, and an optoelectronic chip 140 bonded to the substrate 110. As explained in detail below, the optoelectronic chip 140 includes an optical element 144 which is optically coupled to the waveguide 120. In the illustrated example, the optical element 144 directly engages the waveguide 120.

The substrate 110 illustrated in FIG. 1 may be implemented by any type of substrate. Thus, the substrate 110 may be formed from any desired type of material. For example, the substrate 110 may be made of an insulative, non-conductive material. The substrate 110 may also have any desired form. In the illustrated example, however, the substrate 110 is made from a dielectric material and includes a generally planar surface conducive to flip-chip bonding and/or waveguide coupling. Additionally, the substrate 110 may include one or more circuits or portions of circuits. For instance, circuit lines or traces may be printed on or layered within the substrate 110. To couple circuit elements (e.g., an integrated circuit, a capacitor, an inductor, etc.) to the circuit lines or traces, the substrate 110 may further be provided with electrically conductive contacts 111. Solder bumps 115 may be deposited on one or more of the electrically conductive contacts 111 to facilitate bonding of circuit elements to the substrate 110. The solder bumps 115 may be made of any conventional soldering material (e.g., tin, lead, silver, etc.).

By way of a more specific example, the substrate 110 may be implemented by a printed circuit board (PCB) substrate. The PCB may be provided with a chip-bonding surface adapted to mount a flip-chip using flip-chip on board (FCoB) bonding or direct chip attachment (DCA). In such an example, the chip-bonding surface is provided with electrically conductive contacts which are communicatively connected to electrically conductive traces printed on and/or in the PCB substrate.

In another example, the substrate 110 is implemented by a flex-circuit substrate such as a flexible PCB substrate. A flex-circuit substrate generally has material properties that enable bending or flexing of the substrate. The bendability of a flex-circuit substrate makes it particularly useful in mechanically demanding environments. The flex-circuit substrate may be provided with a chip-bonding surface adapted to mount a flip-chip using flip-chip on flex (FCoF) bonding. In such an example, the chip-bonding surface includes electrically conductive contacts that are communicatively connected to electrically conductive traces which are printed on and/or in the flex-circuit substrate.

In still another example, the substrate 110 is implemented by a chip-package substrate such as a flip-chip package (e.g., a FCPGA package). A flip-chip package includes electrically conductive contacts on a chip-bonding surface. These contacts are communicatively connected to a second set of electrically conductive contacts on an opposite surface of the chip-package substrate. The second set of contacts may be coupled, for example, to traces on a PCB.

The waveguide 120 can be implemented by any type of waveguide. For example, the waveguide 120 may be implemented by a planar waveguide or an optical fiber. In the illustrated example, the waveguide 120 is a planar waveguide which includes two cladding layers 122, a lightwave channel layer 124 (also known as a waveguide core), and a mirror 130. Alternatively, the light redirecting function of the mirror 130 can be fulfilled by a volume diffraction grating (not shown) integrated with the waveguide 120. As explained further below, the waveguide 120 of the illustrated example is made of a material having a thermal stability sufficient to withstand the bonding process employed to assemble the example optical package 100.

The lightwave channel layer 124 of the illustrated example is formed from a material that is conducive to communicating lightwaves from a source to a destination. In the waveguide 120, the material forming the waveguide core 124 is a low-loss lightwave communicative material having a refractive index that is larger than the refractive index of the cladding layers 122 such that light entering one end of the waveguide core 124 is trapped within the waveguide core 124 by total internal refraction and, thus, propagates to the second end of the waveguide core 124. The mirror 130 may be implemented in any desired manner. For example, the mirror 130 may be formed by cleaving an end of the waveguide 120. The mirror 130 may also be metallized to promote reflection and reduce loss.

Persons of ordinary skill in the art will readily appreciate that any technique for adhering or otherwise mounting the waveguide 120 to the substrate 110 may be employed. For example, the waveguide 120 may be coupled to the substrate 110 via an adhesive layer 126. Moreover, the waveguide 120 may be positioned on the substrate 110 using a passive or active alignment technique. As will be appreciated by persons of ordinary skill in the art, an active alignment technique is a technique in which a light source such as a laser is illuminated and the output from an object being placed such as a waveguide is measured. The position of the object being placed is adjusted until the measured output is substantially maximized. When a relative maximum is reached, the object is secured in place without further adjustment.

A passive alignment technique is a technique in which an object is placed and secured without illuminating the light source and without measuring the output of the object being placed. For example, a passive alignment technique for mounting the waveguide 120 to the substrate 110 might include programming a pick-and-place machine to align the waveguide 120 with pre-defined fiducial targets located on the substrate 110 and adhering the waveguide 120 to the substrate 110 in accordance with that alignment. Passive alignment is typically considered advantageous to active alignment in that it is generally less expensive in time and money.

The optoelectronic chip 140 may be implemented by any desired integrated circuit having any desired purpose or functionality. In the illustrated example, the optoelectronic chip 140 is implemented by a flip-chip. The flip-chip 140 includes an optical element 144 such as a receiver, a transmitter or a transceiver. The optical element 144 may be formed on an outer surface of the optoelectronic chip 140 as shown in FIG. 1, or formed internally to the optoelectronic chip 140 and optically accessed via an optical aperture (not shown) such as, for example, a sealed window. The optical element 144 or optical aperture may be directly engaged with or butt coupled to the top surface or top cladding layer 122 of the example waveguide 120.

In the illustrated example, at least a portion of the bottom surface of the flip-chip 140 directly engages the top surface or top cladding layer 122 of the waveguide 120 such that no air gap exists between the flip-chip 140 and the waveguide 120. Additionally, at least a portion of the bottom surface of the flip-chip 140 includes solder bumps 145 that are deposited on die electrical contacts 117. Furthermore, the flip-chip 140 is coupled to the substrate 110 via the solder bumps 115, 145. The flip-chip 140 can be made to directly engage the waveguide 120 by pushing or applying a pushing force to the flip-chip 140 in a direction toward the waveguide 120. However, applying the pushing force at flip-chip bonding temperatures may cause the flip-chip 140 to damage the waveguide 120. The methods and apparatus disclosed herein achieve direct engagement of the flip-chip 140 to the waveguide 120 (i.e., no air gap) without causing damage to the waveguide 120.

During a flip-chip bonding process, the flip-chip 140 of FIG. 1 is positioned on the substrate 110 so that each flip-chip solder bump 145 is aligned with a respective one of the substrate solder bumps 115. Additionally, the optical element 144 is positioned over a portion of the waveguide 120. The waveguide 120 is, thus, at least partially disposed between the substrate 110 and the flip-chip 140. Furthermore, in the illustrated example, the waveguide 120 is positioned on the substrate 110 so that the mirror 130 is positioned to reflect light between the optical element 144 and the waveguide 120.

Positioning the example flip-chip 140 on the substrate 110 creates a flip-chip-substrate gap or separation height between the bottom surface of the flip-chip 140 and the top surface of the substrate 110. The separation height between the optoelectronic chip 140 and the substrate 110 is equivalent to a combined height of the flip-chip solder bumps 145 and the substrate solder bumps 115. In particular, prior to soldering, the combined height of the bumps 115, 145 exceeds a combined thickness of the waveguide 120 and the adhesive layer 126. Also, after the flip-chip 140 is bonded to the substrate 110, the separation height is equivalent to the combined thickness of the waveguide 120 and the adhesive layer 126. The separation height can be controlled by controlling the vertical position of the flip-chip 140 during the flip-chip bonding process to prevent the flip-chip 140 from damaging the waveguide 120.

An example method that may be used to control the vertical position of the flip-chip 140 is to define the size of the die solder bumps 145 and the substrate solder bumps 115 so that their combined height is slightly greater than the combined thickness of the waveguide 120 and the adhesive layer 126 prior to the flip-chip bonding process.

Figure 2:
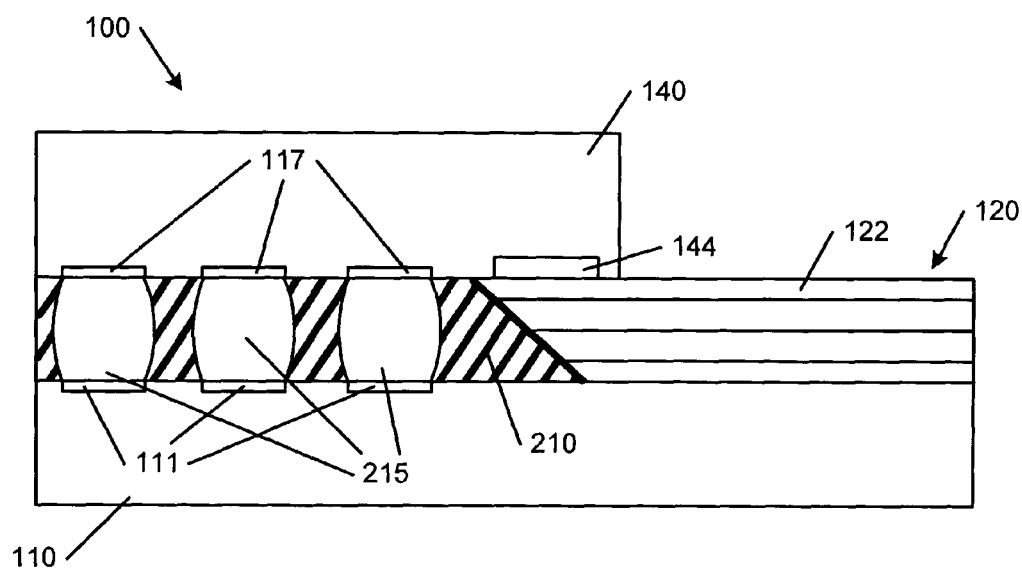
FIG. 2 is a side view of the example optical package of FIG. 1, but showing the package after having undergone a bonding process.

Using the defined solder bump sizes, a soldering process known as a tack-and-reflow flip-chip bonding process may be used to bond the flip-chip 140 to the substrate 110. The tack-and-reflow flip-chip bonding process includes tacking the flip-chip 140 to the substrate 110 and maintaining a constant pressure between the flip-chip 140 and the substrate 110 at a temperature below that of the melting point of solder. The constant pressure is applied for a short period of time, then released, after which the solder bumps 115, 145 are heated to the melting point of solder, thereby causing them to melt and bond to each other to form solder bonds 215 as shown in FIG. 2. More specifically, the flip-chip solder bumps 145 bond to a respectively aligned one of the substrate solder bumps 115 to form the solder bonds 215. Any or all of the substrate 110, the waveguide 120 and/or the flip-chip 140 may be heated either directly or indirectly as a result of the bonding process. Consequently, the substrate 110, the waveguide 120 and the flip-chip 140 should be structured to withstand the temperatures associated with the bonding process without sustaining damage. For example, the waveguide 120 should be implemented by a waveguide having a glass transition temperature higher than the melting point of the solder bumps 115, 145.

In the illustrated example, melting the solder bumps 115, 145 creates a tension force 160 that draws the flip-chip 140 toward the substrate 110 (or vice versa). This tension force 160 from the molten solder causes the optical element 144 to abut the waveguide 120 such that no gap exists therebetween.

Another example method that may be used to control the vertical position of the optoelectronic chip 140 includes using a high placement accuracy thermocompression (TC) bonder (not shown) to place the optoelectronic chip 140 on the substrate 110 using a z-axis distance control mode. The TC bonder can be used to control the vertical position of the optoelectronic chip 140 during a placement of the flip-chip 140 and the flip-chip bonding process. In this manner, the separation height between the flip-chip 140 and the substrate 110 is controlled. More specifically, during the flip-chip bonding process, the TC bonder pushes the optoelectronic chip 140 toward the substrate 110 in a controlled manner so that the separation height between the bottom of the optical element 144 and the top surface of the substrate 110 is equal to the combined thickness of the waveguide 120 and the adhesive layer 126. Therefore, no air-gap is formed between the optical element 144 and the waveguide 120 after the flip-chip bonding process.

Following the soldering process, an underfill 210 is disposed between the flip-chip 140 and the substrate 110 as shown in FIG. 2. The underfill 210 may comprise a non-conductive material and may be used to fill any space or spaces in the area between the flip-chip 140 and the substrate 110. Because there is no space between the optical element 144 and the waveguide 120, the underfill 210 and other contaminants are prevented from entering between those elements and, thus, do not interfere with the optical coupling of the optical element 144 and the waveguide 120.

In addition to preventing entry of contaminants, directly engaging the optical element 144 and the waveguide 120 is advantageous in several respects. For example, a gap between the flip-chip 140 and the waveguide 120 would result in a chip-air interface and an air-waveguide interface. Fresnel losses and/or beam divergence often occur when light crosses such interfaces. Therefore, the direct engagement of the optical element 144 and the waveguide 120 may reduce or eliminate Fresnel losses and beam divergence otherwise associated with chip-waveguide interfaces.

Figure 3:
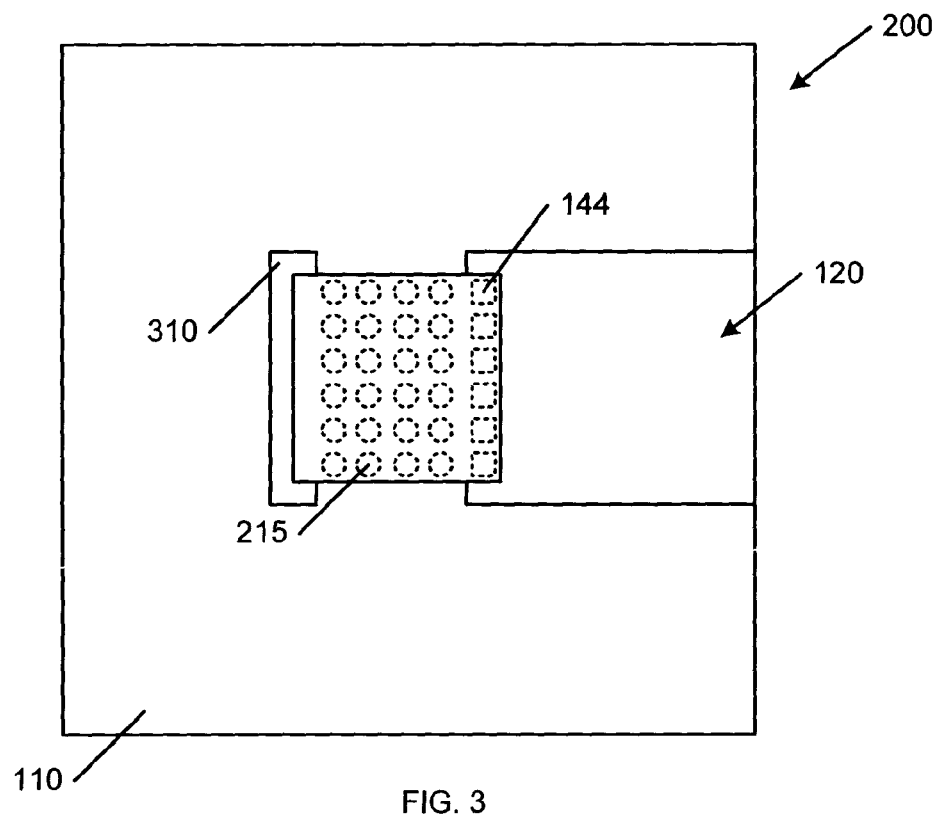
FIG. 3 is a top view of another example optical package which includes an example spacer.

FIG. 3 is a top view of another example optical package 200. The example optical package 200 of FIG. 3 is similar to the example optical package 100 of FIGS. 1-2. In view of that similarity, identical components appearing in both of the packages 100, 200 will not be re-described here. Instead, the interested reader is referred to the above description of the example optical package 100 for a complete discussion of those elements. To facilitate that process, like structures are labeled with like reference numerals in the example of FIGS. 1-2 and the example of FIG. 3.

Unlike the example optical package 100 illustrated in FIGS. 1-2, the example optical package 200 shown in FIG. 3 includes an example spacer element 310 mounted on the substrate 110. The example spacer element 310 may be implemented by a planar waveguide. Because the example spacer element 310 is not used to conduct light, when implemented by a waveguide, the example spacer element 310 may be referred to as a passive waveguide, while the waveguide 120 may be referred to as an active waveguide. Prior to positioning the flip-chip 140 on the substrate 110, the example spacer element 310 of FIG. 3 is adhered or otherwise mounted on the substrate 110. In the illustrated example, the example spacer element 310 is positioned in a fixed location at a position to engage and support an edge of the flip-chip 140 opposite the edge of the flip-chip 140 that contacts the active waveguide 120. Additionally, the example spacer element 310 is positioned so as to not interfere with the formation of the solder bonds 215. When the solder bonds 215 are created, the flip-chip 140 is drawn into engagement with both the active waveguide 120 and the example spacer element 310.

In the illustrated example, the example spacer element 310 has the same thickness as the waveguide 120 (indeed, it may be made of a slice of the planar waveguide 120). As a result, when the flip-chip 140 is drawn into engagement with the example spacer element 310 and the waveguide 120, the flip-chip 140 is positioned in a generally horizontal plane with substantially uniform standoff height between the substrate 110 and the flip-chip 140. In addition to providing this uniform standoff height, the example spacer element 310 facilitates the manufacturing process by providing stability of the flip-chip 140 position. Stabilizing the location of the flip-chip 140 assists in keeping proper alignment between the flip-chip solder bumps 145 and the substrate solder bumps 115 throughout the flip-chip bonding manufacturing process.

Following the soldering process, underfill 210 is inserted into the spaces between the flip-chip 140 and the substrate 110 as explained above.

Figure 4:
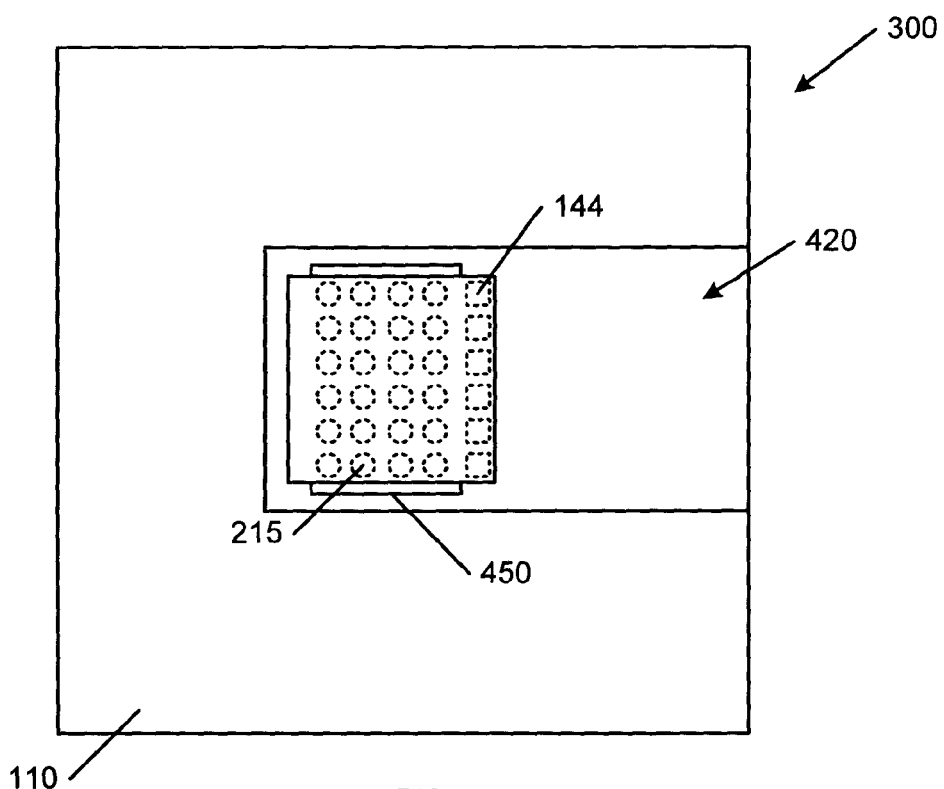
FIG. 4 is a top view of another example optical package which includes another example spacer.

FIG. 4 is a top view of another example optical package 300. The example optical package 300 is similar to the example optical package 200 in most respects. However, an example waveguide spacer 420 of the example of FIG. 4 is integrally formed with the waveguide 120. The example waveguide spacer 420 of FIG. 4 is made of a uniform material and includes a solder bump opening 450 to allow the flip-chip 140 to be bonded to the substrate 110 via the solder bump opening 450.

Although certain example methods, apparatus and articles of manufacture have been described herein, the scope of coverage of this patent is not limited thereto. On the contrary, this patent covers all apparatus, methods and articles of manufacture fairly falling within the scope of the appended claims either literally or under the doctrine of equivalents.

What is claimed is:

1. An apparatus comprising:
   a substrate;
   a waveguide mounted on the substrate; and
   an optoelectronic chip bonded to the substrate and having an optical element on a bottom surface of the optoelectronic chip directly engaging a top surface of the waveguide.

2. An apparatus as defined in claim 1, wherein the optoelectronic chip is a flip-chip.

3. An apparatus as defined in claim 1, wherein the optical element comprises a transceiver, a receiver or a transmitter.

4. An apparatus as defined in claim 1, wherein the optoelectronic chip is bonded to the substrate via an electrical connection between facing surfaces of the optoelectronic chip and the substrate.

5. An apparatus as defined in claim 1, further comprising an underfill material disposed between the optoelectronic chip and the substrate.

6. An apparatus as defined in claim 1, wherein the underfill is not disposed between the optical element and the waveguide.

7. An apparatus as defined in claim 1, wherein the waveguide includes a mirror.

8. An apparatus as defined in claim 7, wherein the mirror includes a metallized mirror.

9. An apparatus as defined in claim 1, wherein the waveguide includes a volume diffraction grating.

10. An apparatus as defined in claim 1, wherein the waveguide includes a planar waveguide.

11. An apparatus as defined in claim 1, further comprising a solder bond between the substrate and the optoelectronic chip to hold the optical element in direct engagement with the waveguide.

12. An apparatus comprising:
a substrate;
a flip-chip having a bottom surface and an optical element on the bottom surface;
a waveguide at least partially disposed between the substrate and the flip-chip, the waveguide having a thermal stability sufficient to withstand a flip-chip bonding temperature; and
solder bumps to couple the flip-chip to the substrate such that the optical element directly engages a top surface of the waveguide.

13. An apparatus as defined in claim 12, wherein facing surfaces of the flip-chip and the substrate are electrically connected.

14. An apparatus as defined in claim 12, wherein a tension force associated with the solder bumps draws the flip-chip and the substrate together when the solder bumps are soldered.

15. An apparatus as defined in claim 14, wherein the tension force causes the flip-chip to engage the waveguide.

16. An apparatus as defined in claim 14, wherein the tension force causes the optical element to directly engage the waveguide.

17. An apparatus as defined in claim 12, wherein the flip-chip is positioned on the substrate using a thermocompression bonder in a z-axis distance control mode.

18. An apparatus as defined in claim 17, wherein the thermocompression bonder causes the flip-chip to directly engage the waveguide.

19. An apparatus as defined in claim 17, wherein the thermocompression bonder causes the optical element to directly engage the waveguide.

20. An apparatus as defined in claim 12, wherein the solder bumps are further to hold the optical element in direct engagement with the waveguide.

21. An apparatus as defined in claim 12, wherein the solder bumps are further to hold the optical element in direct engagement with the waveguide.

22. An apparatus comprising;
a substrate having a first plurality of solder bumps;
a waveguide mounted to the substrate; and
a flip-chip having an optical element and a second plurality of solder bumps, the first and second plurality of solder bumps having a combined thickness prior to soldering which is greater than a height of the waveguide to cause the optical element to directly engage a top surface of the waveguide after a soldering process.

23. An apparatus as defined in claim 22, wherein, after soldering, the combined thickness is approximately equal to the height of the waveguide.

24. An apparatus as defined in claim 22, wherein the waveguide has a glass transition temperature above the melting point of the solder bumps.

25. An apparatus as defined in claim 22, wherein the substrate includes a FCPGA substrate.

26. An apparatus as defined in claim 22, wherein the first and second plurality of solder bumps are further to hold the optical element in direct engagement with the waveguide.

27. An apparatus comprising;
a substrate;
a flip-chip coupled to the substrate;
an optically active waveguide mounted to the substrate and directly engaging the flip-chip; and,
a passive waveguide not configured to conduct light corresponding to the operation of the flip-chip and located to maintain a predetermined separation between the flip-chip and the substrate.

28. An apparatus as defined in claim 27, wherein the active waveguide and the passive waveguide are separate waveguides.

29. An apparatus as defined in claim 27, wherein the optically active waveguide is further to directly engage an optical element of the flip-chip.

30. An apparatus as defined in claim 29, further comprising a solder bond between the substrate and the flip-chip to hold the optically active waveguide in direct engagement with the optical element of the flip-chip.

31. An apparatus as defined in claim 27, wherein the active waveguide and the passive waveguide are integrally formed.

* * * * *